(12) United States Patent
Tada et al.

(10) Patent No.: US 10,305,034 B2
(45) Date of Patent: May 28, 2019

(54) VARIABLE RESISTANCE ELEMENT AND METHOD FOR PRODUCING VARIABLE RESISTANCE ELEMENT

(71) Applicant: NEC Corporation, Minato-ku, Tokyo (JP)

(72) Inventors: Munehiro Tada, Tokyo (JP); Naoki Banno, Tokyo (JP); Koichiro Okamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/577,408

(22) PCT Filed: Jun. 8, 2016

(86) PCT No.: PCT/JP2016/002769
§ 371 (c)(1),
(2) Date: Nov. 28, 2017

(87) PCT Pub. No.: WO2016/199412
PCT Pub. Date: Dec. 15, 2016

(65) Prior Publication Data
US 2018/0166630 A1      Jun. 14, 2018

(30) Foreign Application Priority Data

Jun. 11, 2015 (JP) ................................. 2015-118014

(51) Int. Cl.
*H01L 45/00* (2006.01)

(52) U.S. Cl.
CPC ........ *H01L 45/1266* (2013.01); *H01L 45/085* (2013.01); *H01L 45/1233* (2013.01); *H01L 45/1253* (2013.01); *H01L 45/145* (2013.01); *G11C 2213/51* (2013.01);
(Continued)

(58) Field of Classification Search
None
See application file for complete search history.

(56) References Cited

U.S. PATENT DOCUMENTS

| 6,504,228 B1 | 1/2003 | Sone |
| 2008/0048164 A1 | 2/2008 | Odagawa |

(Continued)

FOREIGN PATENT DOCUMENTS

| JP | 2000-114482 A | 4/2000 |
| JP | 2001-085642 A | 3/2001 |

(Continued)

OTHER PUBLICATIONS

Munehiro Tada et al., "Polymer Solid-Electrolyte Switch Embedded on CMOS for Nonvolatile Crossbar Switch", IEEE Transactions on Electron Devices, vol. 58, No. 12, Dec. 2011, pp. 4398-4406.
(Continued)

*Primary Examiner* — Minh Loan Tran

(57) ABSTRACT

In order to improve the number rewrites by improving the dielectric breakdown resistance of an ion conducting layer in a variable resistance element, this variable resistance element is provided with: a first electrode that contains at least copper; a second electrode that contains at least Ru, nitrogen and a first metal; and an ion conducting layer that is positioned between the first electrode and the second electrode.

10 Claims, 8 Drawing Sheets

(52) U.S. Cl.
CPC ............ *H01L 45/08* (2013.01); *H01L 45/124* (2013.01); *H01L 45/14* (2013.01); *H01L 45/146* (2013.01)

(56) References Cited

U.S. PATENT DOCUMENTS

| | | | |
|---|---|---|---|
| 2011/0272664 A1* | 11/2011 | Tada | H01L 27/228 257/4 |
| 2012/0211719 A1 | 8/2012 | Haimoto et al. | |
| 2012/0314479 A1 | 12/2012 | Mizuguchi et al. | |
| 2013/0234097 A1 | 9/2013 | Fujii et al. | |
| 2015/0340609 A1* | 11/2015 | Banno | H01L 45/085 257/4 |

FOREIGN PATENT DOCUMENTS

| | | |
|---|---|---|
| JP | 2008-021750 A | 1/2008 |
| JP | 2010-010582 A | 1/2010 |
| JP | 2011-198909 A | 10/2011 |
| JP | 2012-174766 A | 9/2012 |
| JP | 2012-256772 A | 12/2012 |
| JP | 2013-162086 A | 8/2013 |
| WO | 2010/079816 A1 | 7/2010 |
| WO | 2013/190988 A1 | 12/2013 |

OTHER PUBLICATIONS

International Search Report dated Aug. 16, 2016, in counterpart International Application No. PCT/JP2016/002769.

* cited by examiner ptions that are incorporated herein by

VARIABLE RESISTANCE ELEMENT AND METHOD FOR PRODUCING VARIABLE RESISTANCE ELEMENT

This application is a National Stage Entry of PCT/JP2016/002769 filed on Jun. 8, 2016, which claims priority from Japanese Patent Application 2015-118014 filed on Jun. 11, 2015, the contents of all of which are incorporated herein by reference, in their entirety.

TECHNICAL FIELD

The present invention relates to a variable resistance element and a method for producing a variable resistance element and, in particular, to a variable resistance element in which one electrode contains a ruthenium and a method for producing the variable resistance element.

BACKGROUND ART

A semiconductor device including a silicon device has been advancing in integration and decreasing in power consumption due to miniaturization according to the scaling law known as Moore's law and have been developed at such a rate that "integration will be quadrupled in three years". A gate length of Metal Oxide Semiconductor Field Effect Transistor (MOSFET) has been reduced to 20 nm or less in recent years. Because of increase in lithography process costs and physical limits of device dimensions caused by this, device performance improvement by an approach different from the existing scaling law is demanded.

The increase in lithography process costs includes increase in the price of manufacturing a tool and the price of mask sets. The physical limits of device dimensions include operating limits and dimension variation limits.

A rewritable programmable logic device called Field Programmable Gate Array (FPGA) has been developed in recent years as a device that stands midway between a gate array and a standard cell. An FPGA allows a customer himself to configure a circuit at will after manufacturing of a chip. An FPGA has a variable resistance element inside a multi-layered wiring layer and allows a customer himself to make electrical connections of wiring at will. The use of a semiconductor device on which such an FPGA is mounted has enabled improvement of the flexibility in circuit design.

A variable resistance element includes a resistance Random Access Memory (Resistance RAM (ReRAM)), which uses a transition metal oxide, NanoBridge (a Registered Trademark of NEC Corporation), which uses an ion conductor, and the like. An ion conductor is a solid in which ions can freely move in response to application of an electric field or the like.

As a variable resistance element that is likely to improve flexibility in circuit design, Non-Patent Literature 1 (NPL1) discloses a precipitated metal-bridge switching element that makes use of metallic ion migration and electrochemical reaction in an ion conductor. The switching element disclosed in NPL1 is made up of three layers: an ion conducting layer, and first and second electrodes each provided in contact with each of two surfaces of the ion conducting layer. Among them, the first electrode serves to supply metallic ions to the ion conducting layer and is called an active electrode. On the other hand, the second electrode is called an inactive electrode because no metallic ion is supplied from the second electrode.

A switching operation of the variable resistance element will be briefly described. When positive voltage is applied to the first electrode and the second electrode is grounded, metal of the first electrode becomes metallic ions, which dissolve into the ion conducting layer. The metallic ions in the ion conducting layer are precipitated as metal in the ion conducting layer and the precipitated metal forms a metal bridge that connects the first electrode and the second electrode. Since the first electrode and the second electrode are electrically connected by the metal bridge, the switch turns on.

On the other hand, when the first electrode is grounded and positive voltage is applied to the second electrode in the ON state, a portion of the metal bridge is disconnected. Thereby, the electrical connection between the first electrode and the second electrode is disconnected, and the switch turns off. Note that from a stage before the electrical connection completely is disconnected, electrical characteristics change, for example, the resistance between the first electrode and the second electrode increases or the inter-electrode capacitance changes, and the electrical connection eventually is disconnected. In order to turn the switch from the OFF state to the ON state, positive voltage may be applied to the first electrode again and the second electrode may be grounded.

Further, NPL1 discloses a configuration and an operation of a two-terminal switching element in which two electrodes are positioned with an ion conductor between them and a conduction state between the two electrodes are controlled.

Such a switching element is characterized by smaller size and smaller on-resistance than a semiconductor switch such as a MOSFET. Therefore, such a switching element is considered to have promising applications in programmable logic devices. Further, since a conduction state (the ON or OFF state of the element) in the switching element is maintained as it is without having to apply voltage thereto, the switching element can be used as a non-volatile memory element as well.

For example, a plurality of memory cells each of which is a basic unit composed of one selector element such as a transistor and one switching element are arranged in both the vertical direction and the horizontal direction. By arranging memory cells in this way, any memory cell of the plurality of memory cells can be selected by using a word line and bit line. A nonvolatile memory can be implemented, where which information is stored, information "1" or "0" can be read from the on or OFF state of a switching element of the selected memory cell by sensing a conduction state of the switching element.

CITATION LIST

Patent Literature

[PTL1] International Publication No. WO2013/190988

Non Patent Literature

[NPL1] M. Tada, K. Okamoto, T. Sakamoto, M. Miyamura, N. Banno, and H. Hada, "Polymer Solid-Electrolyte (PSE) Switch Embedded on CMOS for Nonvolatile Crossbar Switch", IEEE Transactions on Electron Devices, vol. 58, no. 12, pp. 4398-4405, (2011).

SUMMARY OF INVENTION

Technical Problem

To perform a rewrite in a variable resistance element of the precipitated metal-bridge type described above, voltage needs to be applied in a reset direction when the resistance is to be changed to a high resistance state. In order to obtain a high resistance greater than or equal to 100 MΩ, metal precipitated in the ion conducting layer needs to be recovered by applying voltage. However, there is a problem that repeated rewrites lead to dielectric breakdown and bits that make it impossible to rewrite occur.

Patent Literature 1 (PTL1) proposes to use an alloy containing ruthenium as a second electrode of a variable resistance element. In the variable resistance element in PTL1, adhesion between a metal bridge and a second electrode is improved, and stability of the element is improved and holding ability is improved even when the variable resistance element is programmed at a low current. It is desirable to further improve the long-term reliability of the variable resistance element.

The present invention has been made in order to solve the problem described above and an object of the present invention is to provide a variable resistance element that enables improvement of dielectric breakdown resistance of an ion conducting layer and improvement of the number of possible rewrites and a method for producing the variable resistance element.

Solution to Problem

To achieve the above-mentioned object, a variable resistance element according to the present invention includes a first electrode that contains at least copper, a second electrode that contains at least Ru, nitrogen and a first metal, and an ion conducting layer positioned between the first electrode and the second electrode.

A method for producing a variable resistance element according to the present invention, the method includes: forming a first electrode that contains at least copper, forming an ion conducting layer on the first electrode, and forming, on the ion conducting layer, a second electrode that contains at least Ru, nitrogen and a first metal.

Advantageous Effect of Invention

According to a variable resistance element of the present invention, a second electrode is stabilized, and dielectric breakdown voltage when reset voltage is applied is improved.

DESCRIPTION OF EMBODIMENTS

Figure 1:
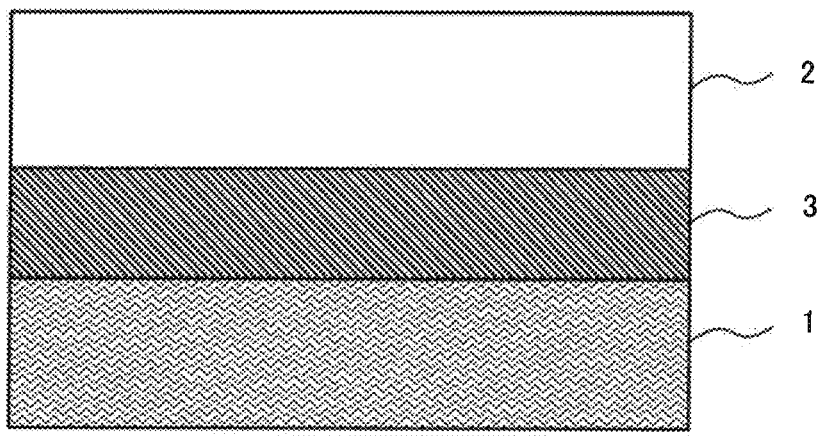
FIG. 1 is a cross-sectional view schematically illustrating a variable resistance element according to a first example embodiment of the present invention.

A variable resistance element in one example embodiment of the present invention has a structure including a first electrode, a second electrode, and an ion conducting layer positioned between the first electrode and the second electrode. In the variable resistance element of the present example embodiment, the first electrode in the variable resistance element including the first electrode, the second electrode and the ion conducting layer positioned between the first electrode and the second electrode is an electrode that contains at least copper (Cu). The variable resistance element of the present example embodiment is characterized in that the second electrode is an electrode that contains at least ruthenium (Ru), nitrogen and a first metal.

This stabilizes the second electrode and improves dielectric breakdown voltage when reset voltage is applied. A content of nitrogen in the second electrode is preferably greater than or equal to 10 atm % and less than 20 atm %. If the second electrode contains nitrogen greater than or equal to 20 atm %, removal of nitrogen occurs and the stability of the electrode decreases.

It is assumed that the first metal of the second electrode is a metal that has standard formation free energy of oxidation that is negatively greater than the ruthenium (Ru). This has an advantageous effect of improving adhesion between a metal bridge and the second electrode when the metal bridge is formed between the first electrode and the second electrode.

Another advantageous effect is that since the first metal is contained in the second electrode, a bond is formed between the first metal and nitrogen, which causes alloying of the second electrode and stabilizes the second electrode. Since this improves a diffusion barrier property against thermal diffusion of copper in the second electrode, thermal diffusion of copper that forms a metal bridge can be prevented and stability of the bridge can be further improved.

The first metal is at least one of titanium (Ti), tantalum (Ta), aluminum (Al), manganese (Mn), zirconium (Zr), hafnium (Hf), magnesium (Mg), cobalt (Co), zinc (Zn), and tungsten (W).

A content of the first metal in the second electrode is preferably greater than or equal to 10 atm % and less than 20 atm %. This is because the present inventors have found that dielectric strength decreases instead of being improved as the content of the first metal is increased to a value greater than or equal to 20 atm %.

Preferably, a ratio between the content of nitrogen and the content of the first metal in the second electrode is stoichiometric. This is because a bonding state is stable if it is a stoichiometric ratio when the first metal forms a nitrogen compound. For example, when the first metal is a trivalent metal, a preferable composition is such that the content of nitrogen and the content of the first metal are equal.

When the sum of the content of nitrogen and the content of the first metal in the second electrode exceeds 40 atm %, the dielectric strength of the ion conducting layer can decrease. Preferably, the sum of the content of nitrogen and the content of the first metal in the second electrode is made less than 40 atm %.

The second electrode preferably has a hexagonal close-packed structure. A crystal structure of ruthenium that is stable at normal temperature and normal pressure is the hexagonal close-packed structure. The second electrode is configured in such a way that the crystal structure of ruthenium is maintained and the surface that is parallel to the ion conducting layer is a close-packed layer regardless of the content of nitrogen and the content of the first metal. The reason is that this has an advantageous effect of stabilizing a connection interface when a metal bridge is formed in the ion conducting layer and the second electrode connects with the formed metal bridge.

The variable resistance element further includes a third electrode that is in contact with the second electrode and is not in contact with the ion conducting layer and the third electrode preferably contains at least the first metal and nitrogen. The third electrode serves to protect the second electrode containing ruthenium during dry etching in a production process. Thermal history during an LSI fabrication process can cause inter-diffusion of constituent materials between the second electrode and the third electrode and the composition of the second electrode may vary. The composition of the second electrode affects a switching operation of the variable resistance element. In order to prevent this, the third electrode preferably contains the first metal and nitrogen beforehand. Further, a ratio between the first metal and nitrogen in the third electrode is preferably equal to the ratio between the first metal and nitrogen in the second electrode. This can further prevent inter-diffusion between the second electrode and the third electrode.

On the other hand, the first electrode preferably contains the first metal. When a metal bridge is formed, addition of the first metal to the first electrode means that the metal bridge also contains the first metal. Since the second electrode also contains the first metal, the adhesion between the metal bridge and the second electrode can be increased and thermal stability of a low resistance state can be improved.

An ion conducting layer that is more likely to produce advantageous effects of the present invention is preferably a film that contains at least silicon (Si) as an element in addition to oxygen (O) and carbon (C).

Example embodiments of the present invention will be described below in detail.

First Example Embodiment

A variable resistance element according to a first example embodiment of the present invention will be described by using a drawing. FIG. 1 is a cross-sectional view schematically illustrating a variable resistance element according to the first example embodiment of the present invention. FIG. 1 is a cross-sectional view schematically illustrating a configuration example of a semiconductor device of the present example embodiment.

As illustrated in FIG. 1, the variable resistance element of the present example embodiment includes a first electrode 1, an ion conducting layer 3 and a second electrode 2. In the variable resistance element in FIG. 1, the ion conducting layer 3 and the second electrode 2 are formed on the first electrode 1 in order. The first electrode 1 is made of metals including copper (Cu) and may be made primarily of copper (Cu). The ion conducting layer 3 contains elements of silicon (Si), oxygen (O) and carbon (C) as materials.

The first electrode 1 and the second electrode 2 of the variable resistance element in the present example embodiment will be described. The first electrode 1 is an electrode that contains copper (Cu). The first electrode 1 serves to supply copper ions to the ion conducting layer. The first electrode 1 may contain a metal such as aluminum (Al), titanium (Ti), tin (Sn), zirconium (Zr), or tantalum (Ta) as an impurity to copper (Cu).

The second electrode 2 serves as an inactive electrode, is preferably made primarily of ruthenium (Ru) and preferably contains nitrogen. Further, the second electrode 2 preferably contains a first metal that has oxidation free energy negatively greater than copper (Cu). The first metal is preferably at least one of titanium (Ti), tantalum (Ta), aluminum (Al), manganese (Mn), zirconium (Zr), hafnium (Hf), magnesium (Mg), cobalt (Co), and zinc (Zn).

Preferably, a sputtering method is used for forming the second electrode 2. When an alloy film is formed by using a sputtering method, there are a method that uses an alloy target of ruthenium (Ru) and the first metal and a co-sputtering method that sputters a ruthenium target and first metal target in the same chamber at the same time. Another method is an inter-mixing method in which a thin film of the first metal is formed beforehand, a film of ruthenium is formed on the thin film by using a sputtering method, and the first metal is alloyed with the energy of impinging atoms. By using the co-sputtering method and the inter-mixing method, the composition of an alloy can be changed. By performing sputtering while introducing nitrogen gas or gas containing nitrogen gas as a sputtering atmosphere, nitrogen can be introduced into an electrode to be formed.

The content of nitrogen in the second electrode is preferably in the range of 10 atm % to 20 atm %. This is because when the content of nitrogen is large, nitrogen is removed from the second electrode due to thermal history in a succeeding process and the quality of the film is destabilized.

The second electrode 2 is preferably made of a material that has a barrier property against copper and copper ions because when copper (Cu) which is a component of the metal bridge comes to be mixed in the second electrode 2, the effect of adding metal that has large standard Gibbs energy in a negative direction is deteriorated. From this viewpoint, the first metal can be selected from among high-melting-point metals such as tantalum (Ta), titanium (Ti), and tungsten (W), for example. The second electrode containing such metals is excellent in both transition from the ON state to the OFF state and the stability of the ON state. The content percentage of the first metal in the second electrode is preferably in the range of 10 atm % to 20 atm %. The sum of the content of nitrogen and the content of the first metal is preferably less than or equal to 40 atm %. This is because a composition ratio that is out of this range destabilizes the second electrode exposed to heat and dielectric breakdown voltage decreases instead of being improved.

The ion conducting layer of the variable resistance element in the present example embodiment will be described next. In the present example embodiment, the ion conducting layer 3 serves to conduct ions. An ion conducting layer that produces advantageous effects of the present example embodiment may be any layer that is capable of electrically conducting metal ions and does not limit advantageous effects of the present example embodiment. For the ion conducting layer 3, an oxide, a nitride, a fluoride, a sulfide, a carbide, an organic polymer, a mixture or a layered structure of any of these, or the like, for example, can be used. From the viewpoint of ensuring the adhesion to the second electrode, which is made primarily of ruthenium (Ru) in the present example embodiment, the ion conducting layer 3 is preferably made of an oxide or a carbide.

Preferably, the ion conducting layer 3 is made primarily of at least silicon (Si) and oxygen (O), for example, as especially preferable materials. The ion conducting layer 3 that has a cyclic siloxane structure composed of silicon (Si) and oxygen (O) facilitates conduction of ions in the film. Further, the ion conducting layer 3 is preferably made of elements of silicon (Si), oxygen (O) and carbon (C). One reason is that carbon (C) contained in the insulating film that serves as the ion conducting layer can make relative permittivity of the ion conducting layer small. Since this steepens a graph of voltage dependence for forming the metal bridge, disturb characteristics in an operating voltage region can be improved.

According to the variable resistance element of the present example embodiment, the second electrode 2 of the variable resistance element is stabilized and dielectric breakdown voltage when reset voltage is applied is improved because the second electrode 2 is configured to contain at least Ru, nitrogen and the first metal.

Second Example Embodiment

Figure 2:
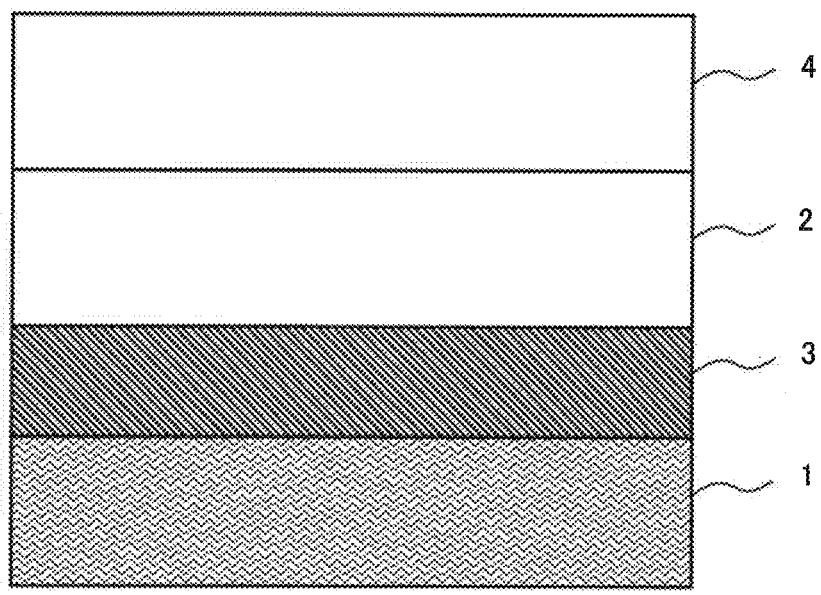
FIG. 2 is a cross-sectional view schematically illustrating a variable resistance element according to a second example embodiment of the present invention.

A variable resistance element according to a second example embodiment of the present invention will be described next by using a drawing. FIG. 2 is a cross-sectional view schematically illustrating a variable resistance element according to the second example embodiment of the present invention.

Like the variable resistance element in FIG. 1, the variable resistance element in FIG. 2 includes a first electrode 1, an ion conducting layer 3 and a second electrode 2. The variable resistance element in FIG. 2 further includes a third electrode 4 that is in contact with the second electrode 2 and is not in contact with the ion conducting layer 3. The third electrode 4 is characterized by containing at least the first metal described above and nitrogen.

The third electrode 4 of the present example embodiment serves to protect the second electrode 2 from damage caused by etching in a production process of the variable resistance element. When the second electrode 2 is fabricated to a prescribed element size and when a contact hole for electrically connecting to the second electrode 2 from outside is provided on the second electrode 2, the third electrode 4 covers the second electrode 2, which contains ruthenium (Ru), so as to prevent the second electrode 2 from being directly exposed. Preventing the second electrode 2 containing ruthenium (Ru) from being directly exposed in such a production process of the variable resistance element prevents the composition of the second electrode 2 from varying.

Further, when the contact hole for electrically connecting to the second electrode 2 from outside is formed, the third electrode 4 also functions as an etching stopper film for etching in order to form the contact hole. Accordingly, a material that has a low etching rate to a fluorocarbon gas plasma used for etching of an insulating film such as silicon oxide in which the contact hole is formed is preferably chosen as the material of the third electrode 4.

The third electrode 4 is preferably made of a metal nitride. However, inter-diffusion (inter-mixing) can occur between the second electrode and the third electrode in a subsequent fabrication process and the composition of the second electrode may vary. The composition of the second electrode affects the switching operation of the variable resistance element. In order to prevent this, the third electrode preferably contains a first metal among materials that function as an etching stopper film and are conductive. The third electrode is preferably made of a nitride of a metal such as titanium (Ti), tantalum (Ta), zirconium (Zr), hafnium (Hf), or tungsten (W), for example. Content percentages of the first metal and nitrogen in the third electrode are preferably equal to content percentages of the first metal and nitrogen in the second electrode. This can further prevent inter-diffusion between the second electrode and the third electrode.

A sputtering method is desirably used to form the third electrode 4. When a sputtering method is used to form a film of a metal nitride, a reactive sputtering method which evaporates a metal target using a mixture gas plasma of nitrogen and argon (Ar) is preferably used. Metal evaporated from the metal target reacts with nitrogen to become a metal nitride, which is formed as a film on a substrate.

According to the variable resistance element in the present example embodiment, as in the first example embodiment, the second electrode 2 is stabilized and dielectric breakdown voltage when reset voltage is applied is improved, because the second electrode 2 is configured to contain at least Ru, nitrogen and the first metal.

Further, according to the variable resistance element of the present example embodiment, the second electrode 2 can be protected from damage caused by etching in a production process of the variable resistance element because the variable resistance element includes the third electrode 4. Further, since the third electrode 4 is configured to contain at least nitrogen and the first metal, a possibility of inter-diffusion (inter-mixing) between the second electrode and the third electrode occurring in a subsequent fabrication process can be reduced. By reducing the possibility of inter-diffusion, a possibility that the composition of the second electrode varies can be reduced.

Example 1

Figure 3:
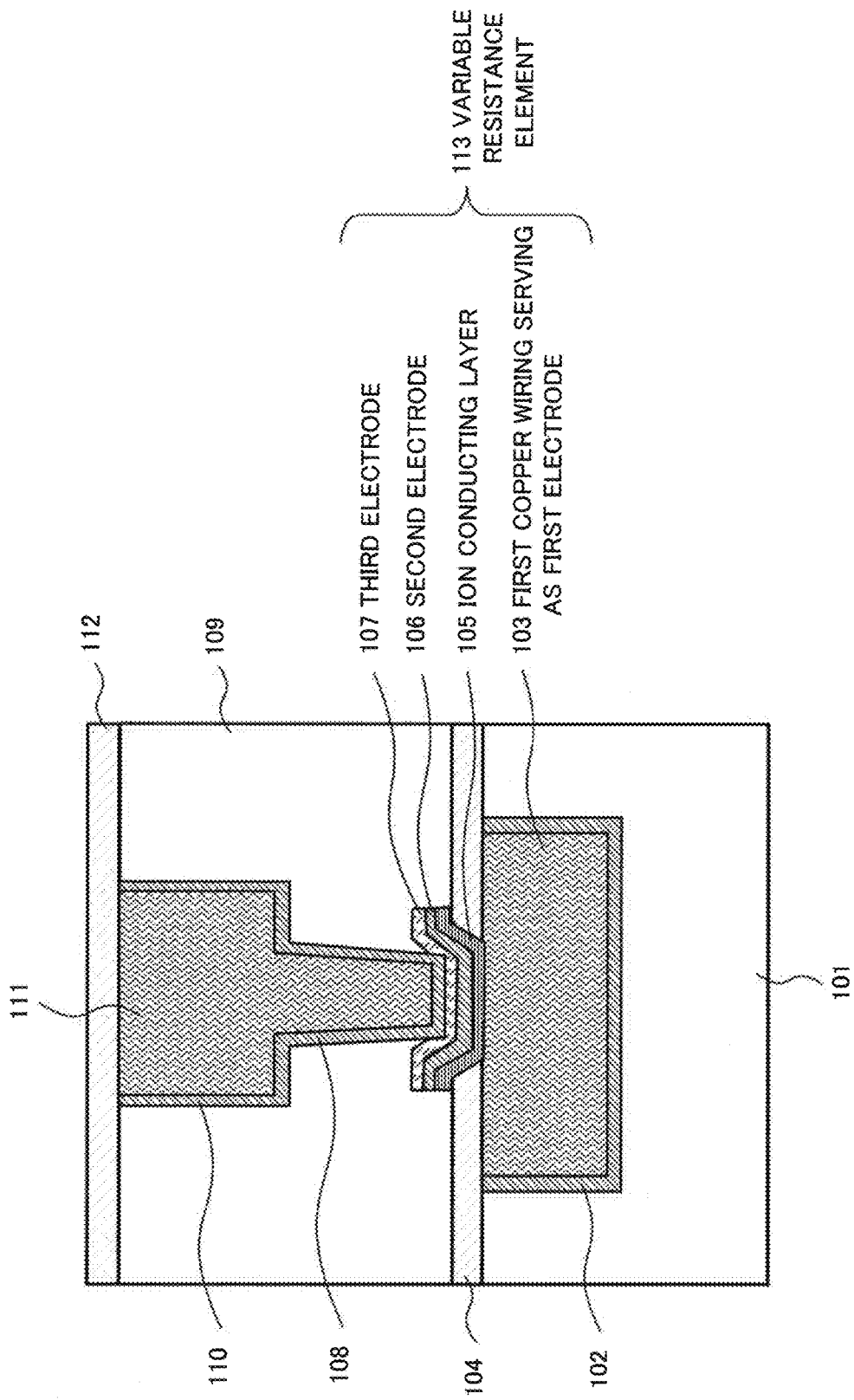
FIG. 3 is a cross-sectional view schematically illustrating the variable resistance element according to the first example of the present invention.

As more specific example embodiments of the present invention, examples will be described below. FIG. 3 is a cross-sectional view schematically illustrating a semiconductor device in which a variable resistance element according to the first example embodiment of the present invention is formed. The semiconductor device in FIG. 3 includes a first interlayer insulating film 101, a barrier metal 102, a first copper wiring 103 serving as a first electrode, a first insulating barrier film 104, an ion conducting layer 105, a second electrode 106, a third electrode 107, and a copper plug 108. The semiconductor device in FIG. 3 further includes a second interlayer insulating film 109, a barrier metal 110, a second copper wiring 111, and a second insulating barrier film 112.

The variable resistance element of the semiconductor device in FIG. 3 includes a first electrode formed in the first interlayer insulating film 101 on a semiconductor substrate (not depicted). The first electrode is an electrode that contains copper (Cu) and also serves as a first copper wiring. The first electrode in FIG. 3 will be referred to as the first copper wiring 103 serving as a first electrode. Side surfaces and a bottom surface of the first copper wiring 103 serving as a first electrode are covered with the barrier metal 102. Upper surfaces of the first copper wiring 103 serving as a first electrode and the first interlayer insulating film 101 are covered with the first insulating barrier film 104. The first insulating barrier film 104 has an opening and at least a portion of the first copper wiring 103 serving as a first electrode is exposed at a bottom of the opening. The ion conducting layer 105, the second electrode 106, and the third electrode 107 are embedded in the opening of the first insulating barrier film 104 in order and side surfaces of these films are processed by dry etching. These films constitute a variable resistance element 113 together with the first copper wiring 103 serving as a first electrode.

A copper plug 108 is connected to an upper surface of the third electrode 107 through the barrier metal 110; the copper plug 108 is formed inside the second interlayer insulating film 109 by a dual damascene process and is integrated and connected with the second copper wiring 111. Upper surfaces of the second copper wiring 111 and the second interlayer insulating film 109 are covered with the second insulating barrier film 112.

The semiconductor substrate is a substrate on which a semiconductor device is formed. A substrate such as a silicon substrate, a mono-crystalline substrate, a Silicon On Insulator (SOI) substrate, a Thin Film Transistor (TFT) substrate, or a substrate for manufacturing liquid crystal can be used as the semiconductor substrate.

The first interlayer insulating film 101 in FIG. 3 is an insulating film formed on the semiconductor substrate. A silicon oxide film, a low-permittivity film (for example, a SiOCH film) or the like that has a lower relative permittivity than a silicon oxide film may be used as the first interlayer insulating film 101, for example. The first interlayer insulating film 101 may be a plurality of insulating films stacked together.

The first insulating barrier film 104 and the second insulating barrier film 112 are insulating films that have a diffusion barrier property against copper (Cu). Further, the first insulating barrier film 104 and the second insulating barrier film 112 also act as etching stopper layers during etching of a via hold for forming a copper plug. For the first insulating barrier film 104 and the second insulating barrier film 112, SiN, SiC, SiCN or the like, for example, may be used.

The second interlayer insulating film 109 is an insulating film formed on the first insulating barrier film 104. A silicon oxide film, a low-permittivity film (for example, a SiOCH film) or the like that has a lower relative permittivity than a silicon oxide film may be used as the second interlayer insulating film 109. The second interlayer insulating film 109 may be a plurality of insulating films stacked together. A wiring groove for embedding the first copper wiring 103 serving as a first electrode is formed in the first interlayer insulating film 101 and the first copper wiring 103 serving as a first electrode is embedded in the wiring groove with the barrier metal 102 between the first interlayer insulating film 101 and the first copper wiring 103 serving as a first electrode.

The first copper wiring 103 serving as a first electrode and the ion conducting layer 105 are in direct contact with each other through an opening in the first insulating barrier film 104. Note that the first copper wiring 103 serving as a first electrode is made primarily of copper (Cu) and preferably contains a first metal which is alloyed.

The barrier metal 102 is a conductive film with a barrier property, which covers the side surfaces and the bottom surface of the first copper wiring 103 serving as a first electrode, in order to prevent metal contained in the first copper wiring 103 serving as a first electrode from diffusing into the first interlayer insulating film 101 and a layer under the first interlayer insulating film 101. For the barrier metal 102, a high-melting-point metal such as tantalum (Ta), tantalum nitride (TaN), titanium nitride (TiN), or tungsten carbonitride (WCN), or a nitride thereof or the like or a film stack thereof may be used.

The first insulating barrier film 104 has an opening. The opening in the first insulating barrier film 104 is formed in a region that includes at least the first copper wiring 103 serving as a first electrode. The wall surface of the opening in the first insulating barrier film 104 is a tapered surface that is gradually widened away from the center of the opening. This can keep good embedded characteristics of the ion conducting layer 105, the second electrode 106 and the third electrode 107.

The ion conducting layer 105 is a film having a resistance that is changed by precipitation of a metal bridge. For example, the ion conducting layer 105 may be an insulating film of an oxide containing tantalum (Ta), and $Ta_2O_5$, TaSiO or the like can be used as the oxide containing tantalum (Ta). Further, the ion conducting layer 105 may be a stacked structure in which $Ta_2O_5$ and TaSiO are stacked in order from the bottom. In a case where a variable resistance material is used as the ion conducting layer, such a stacked structure enables a bridge of metal ions (for example, copper ions) formed inside the ion conducting layer in the presence of low resistance (when the variable resistance element is on) to be recovered as metal ions when the variable resistance element is off. Metal ions can be easily recovered by separation by the $Ta_2O_5$ layer in the stacked structure when the variable resistance element is off and switching characteristics can be improved. The ion conducting layer 105 may be a sulfide such as $Cu_2S$ or GeS and may be a stacked structure of an oxide and a sulfide.

By using the configuration as illustrated in FIG. 3, a variable resistance element according to each example embodiment of the present invention can be formed inside a copper wiring of a semiconductor device. Since the first electrode also serves as a copper wiring, electrode resistance can be reduced while reducing, for simplification, the number of production process steps. A variable resistance element can be provided simply by fabricating at least a 2PR mask set as an additional steps to an ordinary Cu damascene wiring process, thus low resistance and low cost of the element can be achieved at the same time.

ON/OFF of the formed variable resistance element 113 is controlled by applying voltage or current; for example, ON/OFF of the variable resistance element 113 is controlled by using electro-diffusion of metal relating to the first copper wiring 103 serving as a first electrode into the ion conducting layer 105, for example.

The second electrode 106 of the variable resistance element 113 in FIG. 3 contains at least ruthenium (Ru), nitrogen and a first metal. The second electrode 106 is positioned on top of the ion conducting layer 105 and is in direct contact with the ion conducting layer 105. For the second electrode 106, a metal that is less easily ionized, less easily diffused and less ion conductive in the ion conducting layer 105 than copper (Cu) is preferably used, and preferably a metal material that has a smaller absolute value of free energy of oxidation than copper is used. The second electrode 106 contains at least ruthenium (Ru), nitrogen and the first metal as materials that meet the conditions. A metal that has free energy of oxidation that is negatively greater than copper (Cu) is preferably chosen as the first metal and is preferably at least one of Ti, Ta, Al, Mn, Zr, Hf, Mg, Co, Zn and W, for example. To form the second electrode 106, a reactive co-sputtering method is preferably used and sputtering can be performed with nitrogen gas introduced in a sputtering atmosphere. By performing sputtering in a sputtering atmosphere with nitrogen gas introduced, nitrogen can be contained in the formed second electrode 106.

A content percentage of nitrogen in the second electrode 106 is preferably in the range of 10 atm % to 20 atm %. This is because when the content of nitrogen is large, nitrogen is removed due to thermal history in a succeeding process and the film is destabilized. For example, mixture gas of argon (Ar) and nitrogen is supplied as a sputtering atmosphere to a sputtering chamber provided with two targets, ruthenium (Ru) and titanium (Ti). The content of nitrogen in the film to be formed can be controlled by changing the ratio of nitrogen to a gas supplied amount of the whole mixture gas. The content of titanium in the film can be controlled by changing the ratio of power applied to each of the ruthenium (Ru) target and the titanium (Ti) target.

Figure 7:
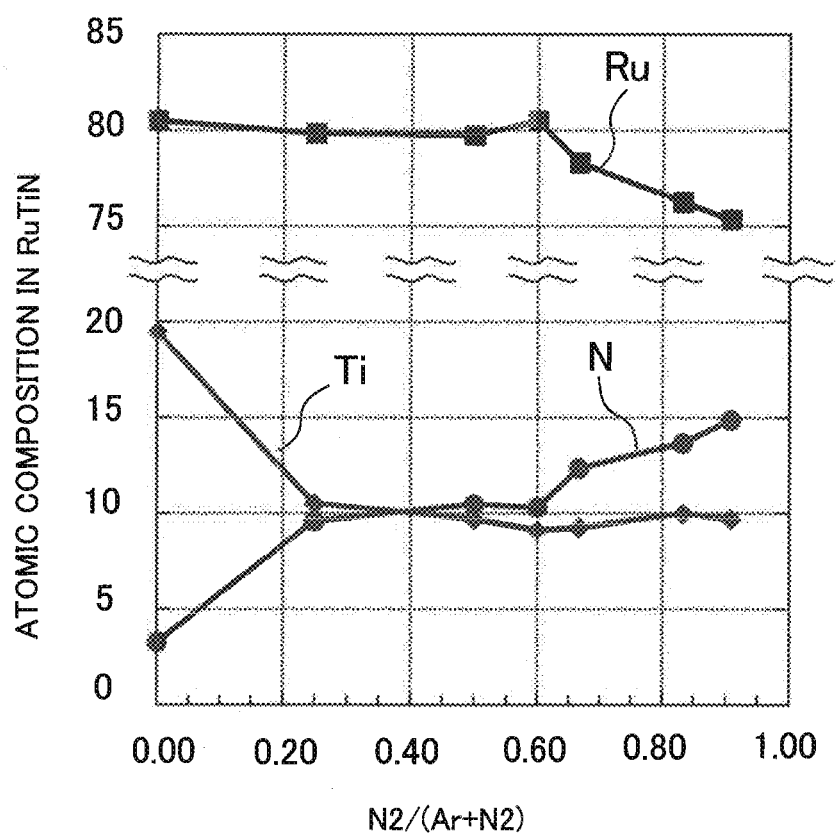
FIG. 7 is a graph illustrating atomic composition in a formed RuTiN film versus ratio of nitrogen in a sputtering atmosphere.

FIG. 7 illustrates an example of a result of formation of a RuTiN film in the case where the first metal is titanium (Ti). The horizontal axis of FIG. 7 represents the ratio of nitrogen ($N_2$) in mixture gas of argon (Ar) and nitrogen as a sputtering atmosphere. The vertical axis of FIG. 7 represents each atomic composition in a RuTiN film versus the ratio of nitrogen in the mixture gas. By maintaining the content percentage of nitrogen in the mixture gas as the sputtering atmosphere in the range between 20% and 60%, the content of nitrogen in the film can be made 10% and the content of the titanium in the film can be made 10%.

Similar experiments also have been conducted by using tantalum (Ta), aluminum (Al) and tungsten (W) and it has been shown that composition ratios can be controlled in a similar way. From this result, it is apparent that control can be similarly performed for Mn, Zr, Hf, Mg, Co and Zn on principles of sputtering system.

The second electrode 106 is preferably made of a material that has a barrier property against copper and copper ions because when copper which is a component of the metal bridge comes to be mixed in the second electrode 106, an effect of adding metal that has large standard Gibbs energy in a negative direction is deteriorated. From this viewpoint, the second electrode 106 can be selected from among materials such as a tantalum nitrogen compound, a titanium nitrogen compound, and a tungsten nitrogen compound, for example. A variable resistance element that uses a material selected from such materials as the second electrode 106 is excellent in both transition from the ON state to the OFF state and the stability of the ON state. The content percentage of the first metal in the second electrode 106 is preferably in the range of 10 atm % to 20 atm %. The sum of the content of nitrogen and the content of the first metal in the second electrode 106 is preferably less than or equal to 40 atm %. This is because a composition ratio that is out of this range destabilizes the second electrode exposed to heat and the dielectric breakdown voltage decreases instead of being improved.

The third electrode 107 is an electrode positioned on top of the second electrode 106. The third electrode 107 serves to protect the second electrode 106. Specifically, the third electrode 107 inhibits damage to the second electrode 106 during a process by protecting the second electrode 106, thereby can maintain switching characteristics of the variable resistance element 113. The third electrode 107 is preferably made of a nitrogen compound containing a first metal, and Ta, Ti, or W can be used as the first metal. Since such nitrogen compounds are stable in the air, their resistances do not become high due to oxidation when a via hole is opened. Further, the third electrode 107 is preferably made of the same material as that of the barrier metal 110. Therefore, a fourth electrode (not depicted) made of the same material as that of the barrier metal 110 may be provided on the third electrode 107. The fourth electrode is electrically connected to the copper plug 108 through the barrier metal 110.

Second Example

Figure 4:
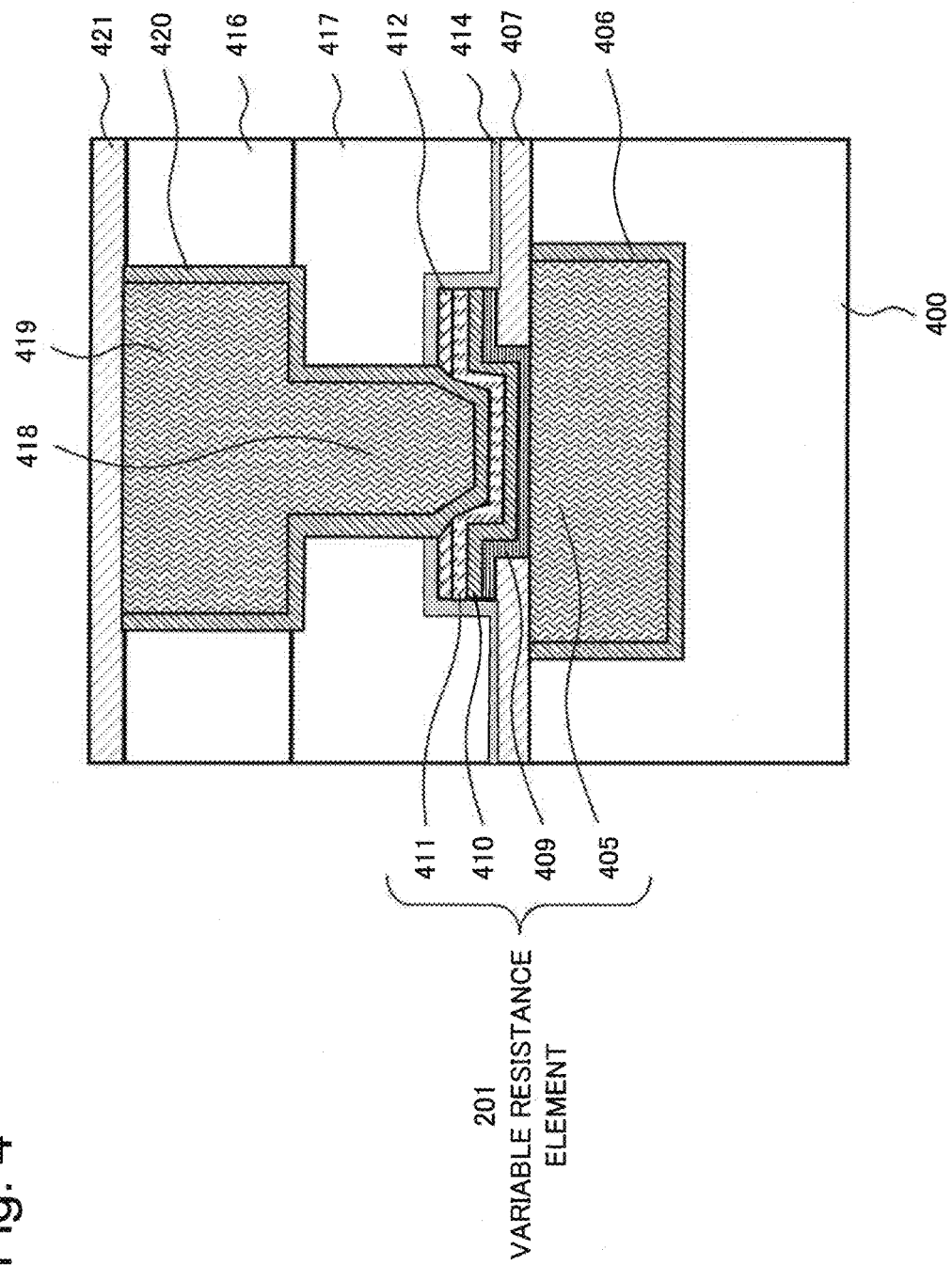
FIG. 4 is a cross-sectional view schematically illustrating the variable resistance element according to the second example of the present invention.

FIG. 4 is a cross-sectional view schematically illustrating a semiconductor device in which a variable resistance element according to a second example of the present invention is formed. The semiconductor device in FIG. 4 includes a first interlayer insulating film 400, a barrier metal 406, a first copper wiring 405 serving as a first electrode, a first insulating barrier film 407, an ion conducting layer 409, a second electrode 410, a third electrode 411, and a protective insulating film 414. The semiconductor device in FIG. 4 further includes a second interlayer insulating film 417, a third interlayer insulating film 416, a copper plug 418, a second copper wiring 419, a barrier metal 420, and a second insulating barrier film 421.

The first copper wiring 405 serving as a first electrode, the ion conducting layer 409, the second electrode 410 and the third electrode 411 constitute a variable resistance element 201. In the variable resistance element 201 in FIG. 4, materials and compositions similar to those of the variable resistance element 113 in FIG. 3 described above can be used. In other words, the first copper wiring 405 serving as a first electrode is an electrode and a wiring made primarily of copper (Cu).

The second electrode 410 of the variable resistance element 201 in FIG. 4 contains at least ruthenium (Ru), nitrogen, and a first metal. For the second electrode 410, a metal that is less easily ionized, less easily diffused and less easily ion conductive in the ion conducting layer 409 than copper (Cu) is preferably used, and preferably a metal material that has a smaller absolute value of free energy of oxidization than copper is used. The second electrode 410 contains at least ruthenium (Ru), nitrogen, and the first metal as materials that meet the conditions.

A metal that has free energy of oxidation that is negatively greater than copper (Cu) is preferably chosen as the first metal and is preferably at least one of Ti, Ta, Al, Mn, Zr, Hf, Mg, Co, Zn and W, for example. The content percentage of nitrogen in the second electrode 410 is preferably in the range of 10 atm % to 20 atm %. The content percentage of the first metal in the second electrode 410 is preferably in the range of 10 atm % to 20 atm %. The sum of the content of nitrogen and the content of the first metal in the second electrode 410 is preferably less than or equal to 40 atm %. This is because a composition ratio that is out of this range destabilizes the second electrode exposed to heat and the dielectric breakdown voltage decreases instead of being improved.

A structure in FIG. 4 will be described below. An opening is provided in the first insulating barrier film 407 such as a SiCN film, and the ion conducting layer 409 is a solid electrolyte, for example, and is made of a material composed primarily of carbon, oxide, hydrogen or silicon, for example. The second electrode 410 is an electrode made primarily of ruthenium (Ru). A third electrode 411 made of TiN or the like, or a high-melting-point nitrogen compound such as TaN may be provided on top of the second electrode 410. A hard mask film 412 as illustrated in FIG. 4 may be further provided between the third electrode 411 and the protective insulating film 414. The third electrode 411 is connected to an upper wiring through the copper plug 418 and may be a copper dual-damascene wiring. Side surfaces and a bottom surface of the copper dual-damascene wiring are enclosed with the barrier metal 420 such as Ta/TaN and the upper surface is covered with the second insulating barrier film 421 such as SiN or SiCN, for example.

In FIG. 4, an insulating laminates including the first interlayer insulating film 400, the first insulating barrier film 407, the protective insulating film 414, the second interlayer insulating film 417, the third interlayer insulating film 416, and the second insulating barrier film 421 that are stacked in this order is provided on top of a semiconductor substrate, not depicted. In the multi-layered wiring layer, a wiring groove is formed in the first interlayer insulating film 400 such as SiOCH. Side surfaces and a bottom surface of the wiring groove are covered with the barrier metal 406 such as Ta/TaN and the first copper wiring 405 serving as a first electrode is further formed on the barrier metal 406 in such a way as to fill the wiring groove. In FIG. 4, the first copper wiring 405 serving as a first electrode is a lower wiring. A contact hole is formed in the protective insulating film 414 such as SiN and the hard mask film 412 such as SiCN, and the copper plug 418 is in contact with the third electrode 411 of the variable resistance element 201 through the contact hole. Further, a wiring groove is formed in the third interlayer insulating film 416 such as SiOCH and the second interlayer insulating film 417 such as SiO$_2$. Side surfaces and bottom surfaces of the contact hole and the wiring groove are covered with the barrier metal 420 such as Ta/TaN. The copper plug 418 is formed in such a way as to fill the contact hole, and the second copper wiring 419 as the upper wiring is formed in such a way as to fill the wiring groove. The second copper wiring 419 and the copper plug 418 are integrated together. In FIG. 4, the first copper wiring 405 serving as a first electrode is the lower wiring.

An opening that communicates with the first copper wiring 405 serving as a first electrode is formed in the first insulating barrier film 407 such as SiCN. The ion conducting layer 409, the second electrode 410, and the third electrode 411 are stacked in this order in such a way as to cover a portion positioned inside the opening of the first copper wiring 405 serving as a first electrode, side surfaces of the opening in the first insulating barrier film 407 and a portion of an upper surface of the first insulating barrier film 407.

A method for producing a variable resistance element part in a method for producing the semiconductor device in FIG. 4 in which the variable resistance element according to the second example of the present invention is formed will be briefly described.

A wiring groove is formed in the first interlayer insulating film 400 and side surfaces and a bottom surface of the wiring groove is covered with the barrier metal 406. Further, the first copper wiring 405 serving as a first electrode is formed in the wiring groove covered with the barrier metal 406. The first copper wiring 405 serving as a first electrode contains at least copper. The first copper wiring 405 serving as a first electrode also functions as a first electrode of the variable resistance element 201. The first insulating barrier film 407 is formed in such a way as to cover the first interlayer insulating film 400 and the first copper wiring 405 serving as a first electrode, then an opening that exposes the first copper wiring 405 serving as a first electrode is formed in the first insulating barrier film 407.

In addition, an ion conductor, which will serve as the ion conducting layer 409, is formed in such a way as to be in contact with at least the first copper wiring 405 serving as a first electrode exposed in the opening. In a case where the variable resistance element 201 has a second electrode 410, a second electrode layer which contains at least ruthenium (Ru), nitrogen and the first metal and will serve as the second electrode 410 is then stacked. In a case where the variable resistance element 201 has a third electrode 411 as illustrated in FIG. 4, a third electrode layer which contains nitrogen and the first metal and will serve as the third electrode 411 is then stacked.

The ion conducting layer 409, the second electrode 410 and/or the third electrode 411 of the variable resistance element 201 are formed by patterning a stacked structure including the third electrode layer, the second electrode layer and the ion conductor or a stacked structure including the second electrode layer and the ion conductor.

Third Example

Figure 5:
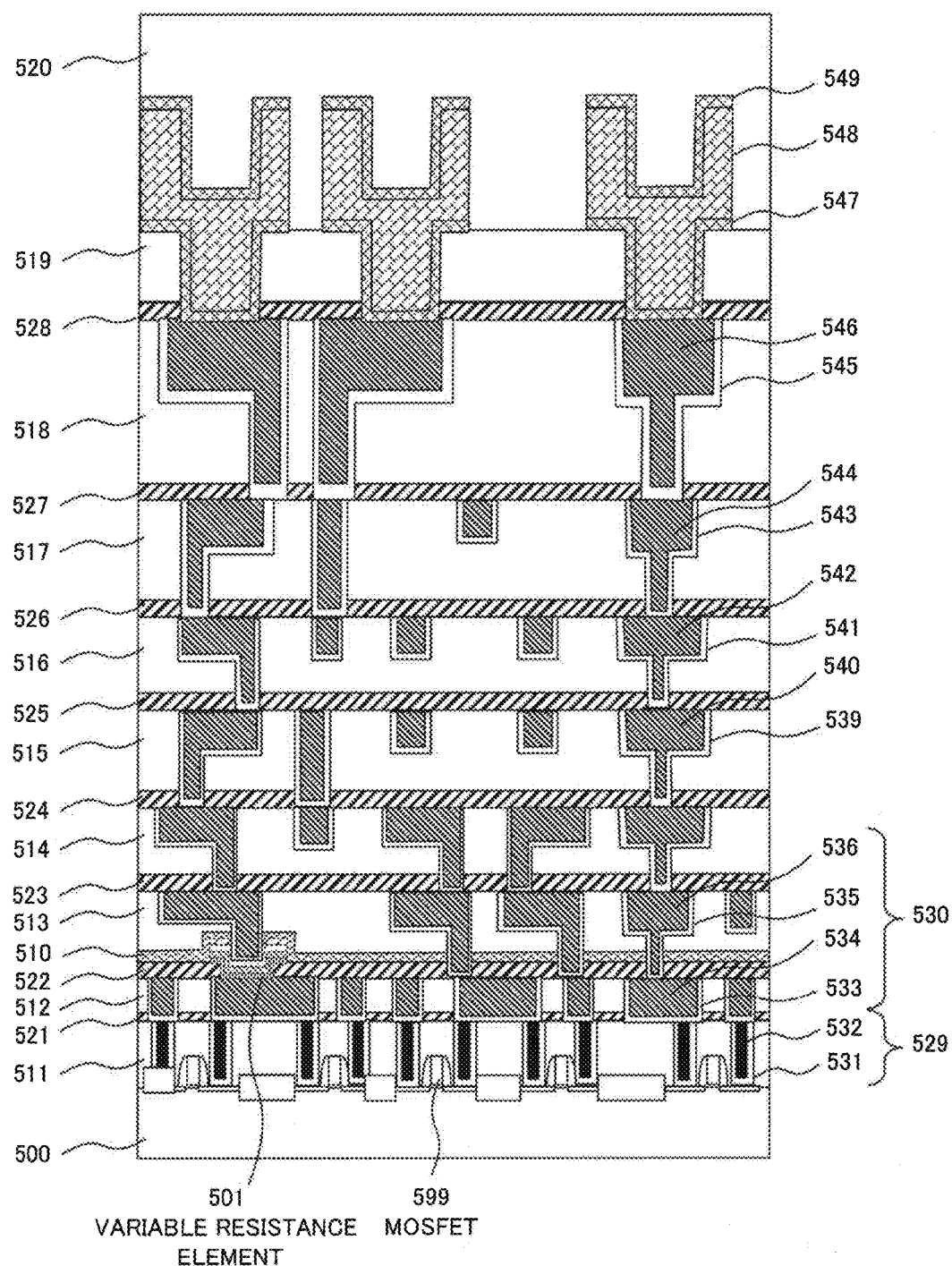
FIG. 5 is a cross-sectional view schematically illustrating a semiconductor device having a multi-layered wiring structure in which a variable resistance element according to a third example of the present invention is formed.

FIG. 5 is a cross-sectional view schematically illustrating a semiconductor device having a multi-layered wiring structure in which a variable resistance element according to a third example of the present invention is formed. A variable resistance element 501 is provided in a multi-layered wiring layer on a Complementary Metal Oxide Semiconductor (CMOS) substrate. A CMOS substrate base in a reconfigurable circuit formation in an example embodiment of the present invention refers to a layer below the variable resistance element 501.

The semiconductor device includes a silicon substrate 500, which is an example of a semiconductor substrate, and a MOSFET 599 formed on the silicon substrate 500. The semiconductor device further includes a multi-layered wiring structure formed on the silicon substrate 500 and the MOSFET 599, and the variable resistance element 501 incorporated into the multi-layered wiring structure.

The multi-layered wiring structure in FIG. 5 includes a plurality of silicon oxide films 511, 519 and SiOCH films 512 to 518, which are vertically stacked insulating films. The multi-layered wiring structure in FIG. 5 further includes silicon carbonitride (SiCN) films 521 to 528 formed between the plurality of silicon oxide films or SiOCH films, and a silicon oxynitride film 520 as a protective film formed on the top layer.

The multi-layered wiring structure in FIG. 5 further includes a tungsten plug 529 formed in such a way that the tungsten plug 529 passes through the thickness direction of the silicon oxide layer 511, which is the bottom layer. The multi-layered wiring structure in FIG. 5 further includes a copper wiring 530 made up of a Cu layer 534 and a barrier metal 533 formed in such a way that the copper wiring 530 passes through the thickness direction of the SiOCH film 512, which is immediately on top of the bottom layer. The multi-layered wiring structure in FIG. 5 further includes a copper wiring 530 made up of a Cu layer 536 and a barrier metal 535 formed in a SiOCH film 513 in a layer above the copper wiring 530 made up of the Cu layer 534 and the barrier metal 533. The multi-layered wiring structure in FIG. 5 further includes a dual damascene pattern formed in each of the SiOCH films 512 to 518, and a top layer wiring formed across the silicon oxide film 519 and the silicon oxy-nitride film 520 of the top layer.

The tungsten plug 529 is made up of a tungsten layer 532 and a TiN layer 531 which covers side surfaces and a bottom surface of the tungsten layer 532. A dual damascene groove is formed in each of the SiOCH films 512 to 518. The dual damascene pattern is made up of Cu layers 540, 542, 544, 546 embedded in the dual damascene grooves and Ta/TaN films 539, 541, 543, 545 which cover side surfaces and bottom surfaces of the Cu layers 540, 542, 544, 546. The Ta/TaN films 539, 541, 543, 545 are barrier metals.

The top layer wiring includes an Al—Cu layer 548 embedded in a groove-like via formed across the silicon oxide film 519 and the silicon oxy-nitride film 520 of the top layer. The top layer wiring further includes a Ti/TiN layer as a barrier metal that covers side surfaces and a bottom surface of the Al—Cu layer 548 in the silicon oxide film 519 and the boundary surface between the silicon oxide film 519 and the silicon oxy-nitride film 520. The top layer wiring further includes a Ti/TiN layer 549 as a barrier metal that covers an upper surface of the Al—Cu layer 548 in the silicon oxy-nitride film 520. The Ti/TiN layer 547 and the Ti/TiN layer 549 of the top layer wiring may be omitted as appropriate. A recess for a connection pad is formed in the upper surface of the Al—Cu layer 548 which constitutes the top layer wiring.

The top layer wiring, each dual damascene pattern, the copper wiring 530 and the tungsten plug 529 are formed in such a way that they are vertically aligned with one another, and the top layer wiring, the tungsten plug 529 and each pattern are electrically connected to a wiring, a plug or a pattern in an upper layer and a lower layer.

The variable resistance element 501 in FIG. 5 is formed between the copper wiring 530 made up of the Cu layer 534 and the barrier metal 533 and the copper wiring 530 made up of the Cu layer 536 and the barrier metal 535.

The variable resistance element 201 illustrated in FIG. 4 of the third example described above can be applied to the present example embodiment. Specifically, the first copper wiring 405 serving as a first electrode in FIG. 4 is replaced with the Cu layer 534 in FIG. 5. Further, an ion conducting layer 409, a second electrode 410, a third electrode 411 and the like as illustrated in FIG. 4 are disposed between the Cu layer 534 and the copper wiring 530 made up of the Cu layer 534 and the barrier metal 533 in FIG. 5. Materials and compositions similar to those of the variable resistance element 113 in FIG. 3 described above and the variable resistance element 201 in FIG. 4 can also be used in the variable resistance element 501 in FIG. 5 as well.

Comparison Example 1

Figure 6:
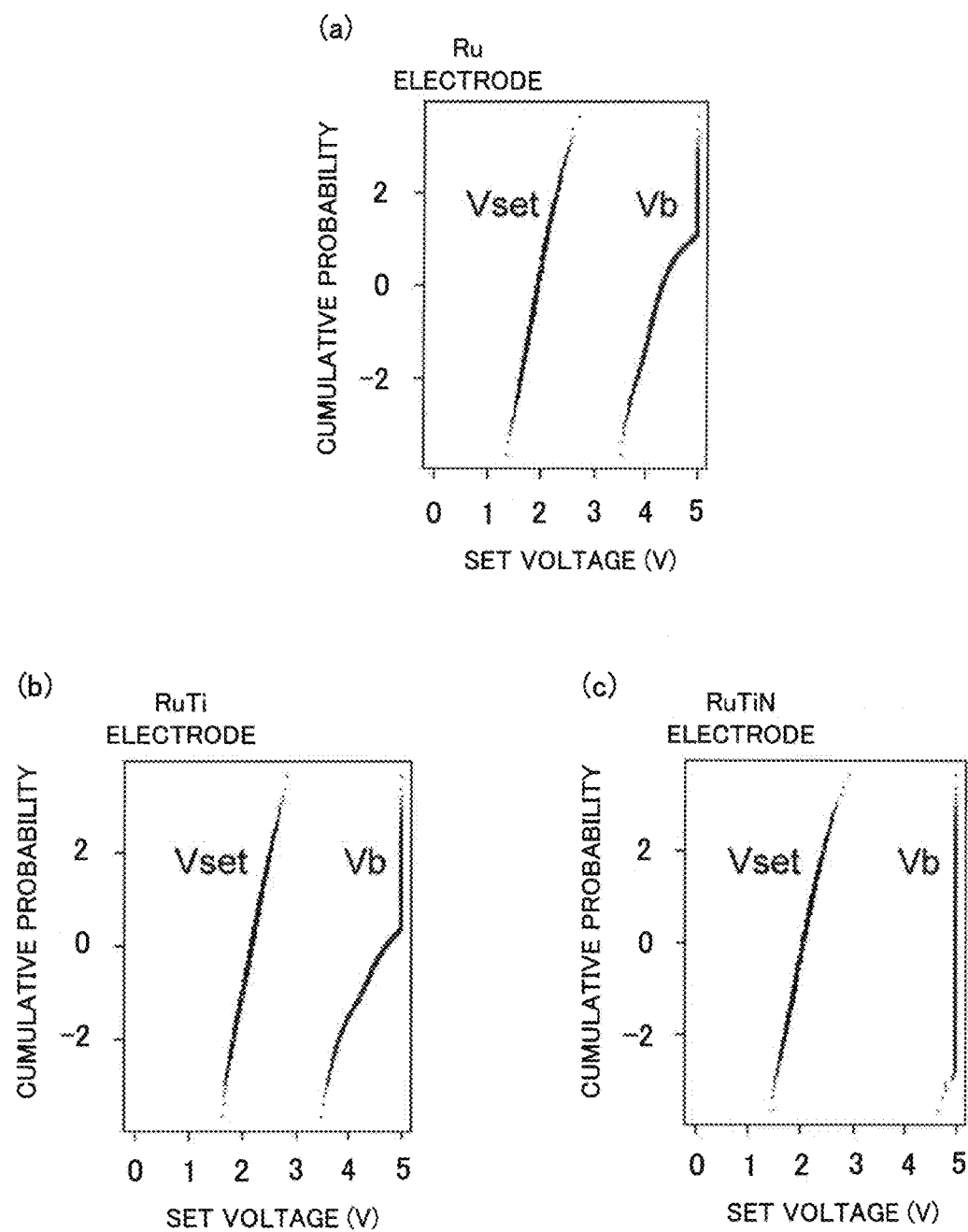
FIG. 6(a) is a graph illustrating switching voltage and dielectric breakdown voltage of a variable resistance element that uses a Ru electrode.
FIG. 6(b) is a graph illustrating switching voltage and dielectric breakdown voltage of a variable resistance element that uses a RuTi electrode.
FIG. 6(c) is a graph illustrating switching voltage and dielectric breakdown voltage of a variable resistance element that uses a RuTiN electrode.

Comparison between a variable resistance element of each example embodiment of the present invention and a variable resistance element of the background art in terms of set voltage (Vset) and dielectric breakdown voltage (Vb) will be given next. FIG. 6(a) is a graph illustrating set voltage and dielectric breakdown voltage of a variable resistance element that uses a Ru electrode and FIG. 6(b) is a graph illustrating set voltage and dielectric breakdown voltage of a variable resistance element that uses a RuTi electrode. FIG. 6(c) is a graph illustrating set voltage and dielectric breakdown voltage of a variable resistance element that uses a RuTiN electrode. Each horizontal axis of FIGS. 6(a) to 6(c) represents set voltage (Vset) when each variable resistance element is programmed from a high-resistance state to a low-resistance state and dielectric breakdown voltage (Vb) at which dielectric breakdown occurs and each vertical axis represents cumulative probability.

FIG. 6(c) illustrates a case where a RuTiN electrode is used as the second electrode of the variable resistance element in the structure illustrated in FIG. 4 described above and corresponds to an example embodiment of the present invention. FIG. 6(a) illustrates a case where a Ru electrode is used as the second electrode of the variable resistance element and FIG. 6(b) illustrates a case where a RuTi electrode is used as the second electrode of the variable resistance element. The cases in FIGS. 6(a) and 6(b) correspond to the background art of the present invention and are examples to be compared with the present invention.

It can be seen from FIGS. 6(a), 6(b) and 6(c) that the set voltage (Vset) are a median 2V in the variable resistance element of the background art and the variable resistance element corresponding to the example embodiment of the present invention, and are nearly equal. It can be seen that the dielectric breakdown voltage (Vb), on the other hand, is improved by making the second electrode of the variable resistance element from RuTiN. This is because the second electrode of the variable resistance element is stabilized as described above. In this case, the content of titanium (Ti) in the second electrode has been 15 atm % and the content of nitrogen has been 15 atm %.

Further, dependence on the content of titanium (Ti) and the content of nitrogen in the second electrode 2 has been investigated and it has been verified that dielectric breakdown voltage is remarkably improved with the content of titanium (Ti) in the range of 10 atm % to 20 atm %. On the other hand, it has been verified that dielectric breakdown voltage is remarkably improved with a content of nitrogen in the range of 10 atm % to 20 atm %.

It has also been found that the content of nitrogen and the content of the titanium (Ti) are preferably equal in these ranges. This is because nitrogen binds to the first metal.

Crystallinity of the second electrode has been evaluated and verified to be a hexagonal close-packed structure. Specifically, it is preferable that a crystal structure is maintained with a base of Ru and, when a metal bridge is formed in the ion conducting layer, the crystal structure produces an advantageous effect of stabilizing the interface between the second electrode and the metal bridge. This is because a stabilizing surface where surface energy is smallest exists in the hexagonal close-packed structure. It has been verified that in order to maintain this crystal structure, a sum of the content of nitrogen and the content of titanium is preferably less than 40%.

A similar result has been obtained in a case where the first metal is tantalum (Ta) and tungsten (W). This suggests that it is preferable that the first metal is a metal material that has a smaller absolute value of free energy of oxidation than copper. The first metal as a material preferable for the second electrode can be selected from among Ti, Ta, Al, Mn, Zr, Hf, Mg, Co, Zn and W, which have negatively greater free energy of oxidation than Cu. It can be determined that among them, Ti, Ta, Al, Zr and W are more preferable from the viewpoint that nitrogen compounds are thermally stable.

Fourth Example

Figure 8:
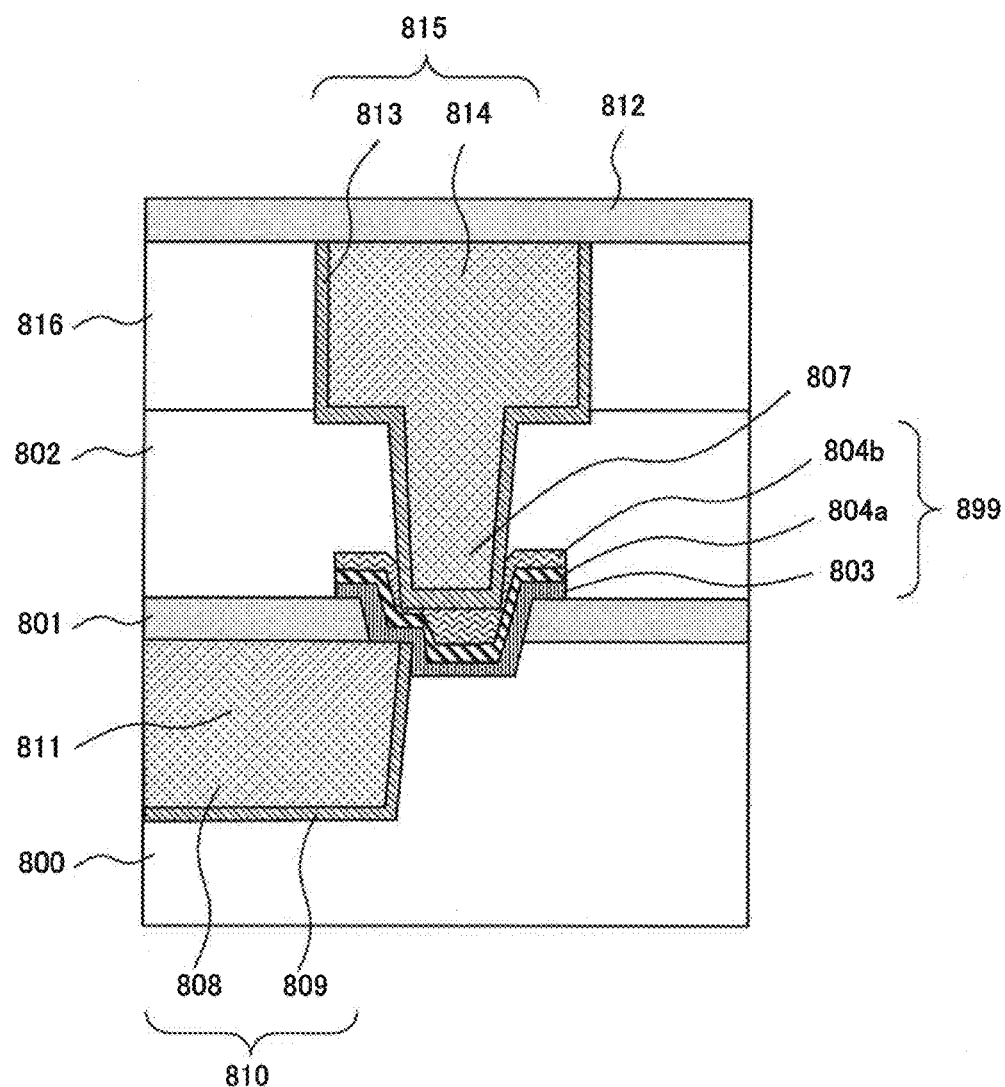
FIG. 8 is a cross-sectional view illustrating a configuration of a semiconductor device in which a variable resistance element according to a fourth example of the present invention is integrated inside a multi-layered wiring layer.

FIG. 8 is a cross-sectional view illustrating a configuration of a semiconductor device in which a variable resistance element according to a fourth example of the present invention is integrated inside a multi-layered wiring layer. In FIG. 8, the variable resistance element is configured as a two-terminal switch.

In FIG. 8, the multi-layered wiring layer includes a first copper wiring 808 serving as a first electrode and a plug 807, and a two-terminal switch 899 includes a second electrode 804a and a third electrode 804b as upper electrodes, and an ion conducting layer 803. The first copper wiring 808 serving as a first electrode in the multi-layered wiring layer also serves as a lower electrode of the two-terminal switch 899. Specifically, the ion conducting layer 803 is inserted between the upper electrodes and the first copper wiring 808 serving as a first electrode. The ion conducting layer 803 is connected to the first copper wiring 808 serving as a first electrode through one opening. The opening is formed in such a way that the opening reaches a portion between an interlayer insulating film 800 and the first copper wiring 808 serving as a first electrode.

The insulating laminates in FIG. 8 includes the interlayer insulating film 800, a barrier insulating film 801, an interlayer insulating film 802, an interlayer insulating film 816 and a barrier insulating film 812. A wiring groove 811 is formed in the interlayer insulating film 800. Side surfaces and a bottom surface of the wiring groove 811 is covered with a barrier metal 809 and the first copper wiring 808 serving as a first electrode is further formed in such a way as to fill the wiring groove 811.

Further, a contact hole is formed in the interlayer insulating film 802 and a wiring groove 811 is formed in the interlayer insulating film 816. Side surfaces and bottom surfaces of the contact hole and the wiring groove 811 are covered with a barrier metal 813. The plug 807 is formed in such a way as to fill the contact hole, and a second wiring 814 is formed in such a way as to fill the wiring groove 811. The second wiring 814 and the plug 807 are integrated together.

An opening that communicates with the first copper wiring 808 serving as a first electrode is formed in the barrier insulating film 801. The ion conducting layer 803, the second electrode 804a and the third electrode 804b are stacked in this order. They are stacked in this order in such a way that they cover a portion positioned inside the opening of the first copper wiring 808 serving as a first electrode, side surfaces of the opening in the barrier insulating film 801, and a portion of an upper surface of the barrier insulating film 901.

The two-terminal switch configured as described above is switched on or off by application of voltage or current. For example, the two-terminal switch is switched by making use of electro-diffusion of metal ions supplied from metal that forms the first copper wiring 808 serving as a first electrode into the ion conducting layer 803.

The interlayer insulating film 800 is an insulating film formed on a semiconductor substrate. The first copper wiring 808 serving as a first electrode is a wiring embedded in the wiring groove 811 formed in the interlayer insulating film 800. The first copper wiring 808 serving as a first electrode also serves as a lower electrode of the two-terminal switch and is in direct contact with the ion conducting layer 803. The first copper wiring 808 serving as a first electrode may be formed of an alloy that contains a metal (for example, copper) that generates metal ions that can diffuse into or can be conducted in the ion conducting layer 803 and aluminum.

The barrier metal 809 is a conductive film with a barrier property, which covers side surfaces and a bottom surface of the first copper wiring 808 serving as a first electrode in order to prevent metal (for example, copper) that forms the first copper wiring 808 serving as a first electrode from diffusing into the interlayer insulating film 800 and an underlayer. The first copper wiring 808 serving as a first electrode and the barrier metal 809 constitute a lower wiring 810.

The barrier insulating film 801 is formed in such a way as to cover the interlayer insulating film 800 and the first copper wiring 808 serving as a first electrode. The barrier insulating film 801 has an opening that communicates with the first copper wiring 808 serving as a first electrode and, inside the opening, the first copper wiring 808 serving as a first electrode and the ion conducting layer 803 is in contact with each other. The ion conducting layer 803 constitutes a variable resistance layer whose resistance is changed by an action (such as diffusion or ion conduction) of metal ions generated from metal that forms the first copper wiring 808 serving as a first electrode.

The second electrode 804a is the lower electrode layer of the upper electrodes and is in direct contact with the ion conducting layer 803. The third electrode 804b is the upper electrode layer of the upper electrodes and is formed on the second electrode 804a. The third electrode 804b serves to protect the second electrode 804a. Specifically, by protecting the second electrode 804a, the third electrode 804b can inhibit damage to the second electrode 804a during a production process and can maintain switching characteristics of the two-terminal switch 899.

The interlayer insulating films 802 and 816 are insulating films formed on the protective insulting film 801. A contact hole for embedding the plug 807 is formed in the interlayer insulating films 802 and 816. The contact hole is covered with the barrier metal 813 and the plug 807 is formed on the barrier metal 813 in such a way as to fill the contact hole. The second wiring 814 is formed on the barrier metal 813 in such a way as to fill the wiring groove 811. The barrier metal 813 and the second wiring 814 constitute an upper wiring 815.

The second wiring 814 is a wiring embedded in the wiring groove 811 formed in the interlayer insulating film 816. The second wiring 814 is integrated with the plug 807. The plug 807 is electrically connected to the third electrode 804b through the barrier metal 813.

In the variable resistance element in FIG. 8, materials and compositions similar to those of the variable resistance element 113 in FIG. 3 and the variable resistance element 201 in FIG. 4 described above can be used.

Fifth Example

Figure 9:
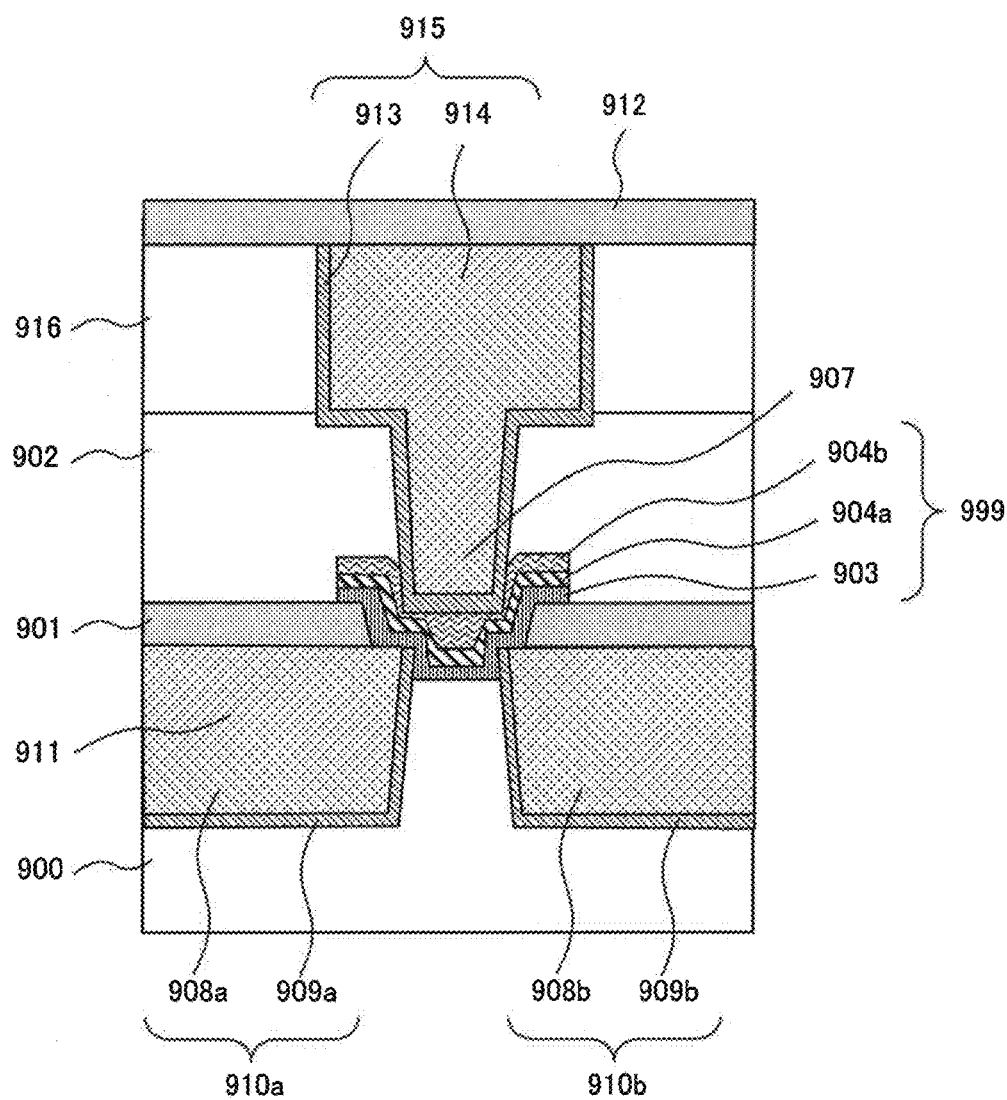
FIG. 9 is a cross-sectional view illustrating a configuration of a semiconductor device in which a variable resistance element according to a fifth example of the present invention is integrated inside a multi-layered wiring layer.

FIG. 9 is a cross-sectional view illustrating a configuration of a semiconductor device in which a variable resistance element according to a fifth example of the present invention is integrated inside a multi-layered wiring layer. In FIG. 9, the variable resistance element is configured as a three-terminal switch.

In FIG. 9, the multi-layered wiring layer includes a pair of first copper wirings 908a and 908b serving as first electrodes and a plug 907, and a three-terminal switch 999 includes a second electrode 904a and a third electrode 904b as upper electrodes, and an ion conducting layer 903. The first copper wirings 908a and 908b serving as first electrodes of the multi-layered wiring layer also serve as lower electrodes of the three-terminal switch 999. Specifically, the ion conducting layer 903 is inserted between the upper electrodes and the first copper wirings 908a and 908b serving as first electrodes. The ion conducting layer 903 is connected to the pair of first copper wirings 908a and 908b serving as first electrodes through one opening. The opening is formed in such a way that the opening reaches a portion of an interlayer insulating film 900 between the first copper wirings 908a and 908b serving as first electrodes.

The insulating laminate in FIG. 9 includes the interlayer insulating film 900, a barrier insulating film 901, an interlayer insulating film 902, an interlayer insulating film 916, and a barrier insulating film 912. A pair of wiring grooves 911 are formed in the interlayer insulating film 900. Side surfaces and bottom surfaces of the wiring grooves 911 are covered with respective barrier metal 909a and 909b, and the pair of first copper wirings 908a and 908b serving as first electrodes are formed in such a way as to fill the pair of wiring grooves 911.

Further, a contact hole is formed in the interlayer insulating film 902 and a wiring groove 911 is formed in the interlayer insulating film 916. Side surfaces and bottom surfaces of the contact hole and the wiring groove 911 are covered with a barrier metal 913. The plug 907 is formed in such a way as to fill the contact hole and a second wiring 914 is formed in such a way as to fill the wiring groove 911. The second wiring 914 and the plug 907 are integrated together.

An opening that communicates with the first copper wirings 908a and 908b serving as first electrodes is formed in the barrier insulating film 901. The ion conducting layer 903, the second electrode 904a and the third electrode 904b are stacked in this order. They are stacked in this order in such a way as to cover a portion positioned inside the opening of the first copper wirings 908a and 908b serving as first electrodes and side surfaces of the opening in the barrier insulating film 901 and a portion of the upper surface of the barrier insulating film 901.

The three-terminal switch configured as described above is switched on or off by application of voltage or current. For example, the three-terminal switch is switched by making use of electro-diffusion of metal ions supplied from metal that forms the first copper wirings 908a and 908b serving as first electrodes into the ion conducting layer 903.

The interlayer insulating film 900 is an insulating film formed on a semiconductor substrate. The first copper wirings 908a and 908b serving as first electrodes are wirings embedded in the wiring grooves 911 formed in the interlayer insulating film 900. The first copper wirings 908a and 908b serving as first electrodes also serve as lower electrodes of the three-terminal switch and are in direct contact with the ion conducting layer 903. The first copper wirings 908a and 908b serving as first electrodes may be formed of an alloy that contains a metal (for example, copper) that generates metal ions that can diffuse into or can be conducted in the ion conducting layer 903 and aluminum.

The barrier metals 909a and 909b cover side surfaces and bottom surfaces of the first copper wirings 908a and 908b serving as first electrodes in order to prevent metal (for example, copper) that forms the first copper wirings 908a and 908b serving as first electrodes from diffusing into the interlayer insulating film 900 and an underlayer. The barrier metals 909a and 909b are conductive films that have a barrier property that prevents metal (for example, copper) that forms the first copper wirings 908a and 908b serving as first electrodes from diffusing into the interlayer insulating film 900 and an underlayer. The first wiring 910a and the barrier metal 909a constitute a lower wiring 910a, and the first wiring 910b and the barrier metal 909b constitute a lower wiring 910a.

The barrier insulating film 901 is formed in such a way as to cover the interlayer insulating film 900 and the first copper wirings 908a and 908b serving as first electrodes. The barrier insulating film 901 has an opening that communicates with the first copper wirings 908a and 908b serving as first electrodes and, inside the opening, the first copper wirings 908a and 908b serving as first electrodes are in contact with the ion conducting layer 903. The ion conducting layer 903 constitutes a variable resistance layer whose resistance is changed by an action (such as diffusion or ion conduction) of metal ions generated from metal that forms the first copper wirings 908a and 908b serving as first electrodes.

The second electrode 904a is the lower electrode layer of the upper electrodes and is in direct contact with the ion conducting layer 903. The third electrode 904b is the upper electrode layer of the upper electrodes and is formed on the second electrode 904a. The third electrode 904b serves to protect the second electrode 904a. Specifically, by protecting the second electrode 904a, the third electrode 904b can inhibit damage to the second electrode 904a during a production process and maintain switching characteristics of the three-terminal switch 999.

The interlayer insulating films 902 and 916 are insulating films formed on the protective insulting film 901. A contact hole for embedding the plug 907 is formed in the interlayer insulating films 902 and 916. The contact hole is covered with the barrier metal 913 and the plug 907 is formed on the barrier metal 913 in such a way as to fill the contact hole. The second wiring 914 is formed on the barrier metal 913 in such a way as to fill the wiring groove 911. The barrier metal 913 and the second wiring 914 constitute an upper wiring 915.

The second wiring 914 is a wiring embedded in the wiring groove 911 formed in the interlayer insulating film 916. The second wiring 914 is integrated with the plug 907. The plug 907 is electrically connected to the third electrode 904b through the barrier metal 913.

In the variable resistance element in FIG. 9, materials and compositions similar to those of the variable resistance element 113 in FIG. 3 and the variable resistance element 201 in FIG. 4 described above can be used.

While the present invention has been described in association with preferable example embodiments and examples thereof, the example embodiments and examples are merely illustrative of the invention and are not meant to limit the present invention.

For example, while the technique for a semiconductor production device that includes a CMOS circuit which is the field of application that is the background of the invention made by the present inventors has been described and examples in which a variable resistance element is formed on top of a copper wiring on a semiconductor substrate have been described, the present invention is not so limited. The present invention can also be applied to a semiconductor product that includes a memory circuit such as a Dynamic RAM (DRAM), a Static RAM (SRAM), a flash memory, a Ferro Electric RAM (FRAM) (Registered Trademark), a Magnetic RAM (MRAM), a resistance change type memory, or the like, for example. Further, the present invention can also be applied to a semiconductor product that includes a memory circuit such as a bipolar transistor, or a semiconductor product that includes a logic circuit such as a microprocessor, or a copper wiring of a board or a package on which such semiconductor products are mounted together.

Further, the present invention can also be used for joining an electronic circuit device, an optical circuit device, a quantum circuit device, a micro-machine, a Micro Electro Mechanical Systems (MEMS) or the like to a semiconductor device. While the description of the present invention has focused on examples of implementations of switching functionality, the present invention can also be used in a memory chip that makes use of both of non-volatility and variable resistance characteristics.

Further, a substrate joining method according to the present invention can be verified from a state after production. Specifically, a lower electrode made of copper, an ion conducting layer and an upper electrode are verified by TEM observation of a cross-section of a device. Additionally, verification can be performed by verifying that a copper wiring is used in a multi-layered wiring and, when a variable resistance element is provided, observing the presence of an ion conducting layer in a state where the lower surface of the variable resistance element is a copper wiring and the copper wiring also serves as a lower electrode. Further, materials used can be verified by conducting composition analysis such as Energy Dispersive X-ray Spectroscopy (EDX) and/or Electron Energy-Loss Spectroscopy (EELS), in addition to TEM.

Specifically, a structure in which an ion conducting layer is formed on a copper wiring and an upper electrode that is in contact with the ion conducting layer contains Ru, nitrogen, and a first metal can be determined to be a structure that uses the present invention.

While the present invention has been described with reference to example embodiments and examples thereof, the present invention is not limited to the example embodiments and examples described above. Various modifications that can be understood by those skilled in the art can be made to configurations and details of the present invention within the scope of the present invention.

Part or whole of the example embodiments described above can also be described as, but not limited to, the following supplementary notes.

(Supplementary Note 1)
A variable resistance element including a first electrode that contains at least copper, a second electrode that contains at least Ru, nitrogen and a first metal, and an ion conducting layer positioned between the first electrode and the second electrode.

(Supplementary Note 2)
The variable resistance element according to Supplementary note 1, wherein the first metal has negatively greater standard formation free energy of oxidation than that of Ru.

(Supplementary Note 3)
The variable resistance element according to Supplementary note 1 or 2, wherein the first metal is at least one of Ti, Ta, Al, Mn, Zr, Hf, Mg, Co and Zn.

(Supplementary Note 4)
The variable resistance element according to any one of Supplementary notes 1 to 3, wherein the second electrode has a hexagonal close-packed structure.

(Supplementary Note 5)
The variable resistance element according to any one of Supplementary notes 1 to 4, wherein a content of nitrogen in the second electrode is greater than or equal to 10 atm % and less than 20 atm %.

(Supplementary Note 6)
The variable resistance element according to any one of Supplementary notes 1 to 5, wherein a content of the first metal in the second electrode is greater than or equal to 10 amt % and less than 20 atm %.

(Supplementary Note 7)
The variable resistance element according to any one of Supplementary notes 1 to 6, wherein a content of the nitrogen and a content of the first metal in the second electrode are equal.

(Supplementary Note 8)
The variable resistance element according to any one of Supplementary notes 1 to 6, wherein a ratio between the nitrogen and the first metal in the second electrode is a stoichiometric composition.

(Supplementary Note 9)
The variable resistance element according to any one of Supplementary notes 1 to 8, wherein the sum of a content of the nitrogen and a content of the first metal in the second electrode is less than or equal to 40 atm %.

(Supplementary Note 10)
The variable resistance element according to any one of Supplementary notes 1 to 9, further including a third electrode that is in contact with the second electrode and is not in contact with the ion conducting layer, wherein the third electrode contains at least the first metal and nitrogen.

(Supplementary Note 11)
The variable resistance element according to any one of Supplementary notes 1 to 10, wherein the first electrode contains the first metal in addition to copper.

(Supplementary Note 12)
A method for producing a variable resistance element, the method including:
forming a first electrode that contains at least copper;
forming an ion conducting layer on the first electrode; and
forming, on the ion conducting layer, a second electrode that contains at least Ru, nitrogen and a first metal.

(Supplementary Note 13)
The method for producing a variable resistance element according to Supplementary note 12, the method including:
forming a first electrode layer that contains at least copper, forming an insulting film that covers the first electrode layer, then forming an opening that exposes a portion of the first electrode layer, and forming an ion conductor in such a way as to be in contact with the first electrode layer exposed in the opening in the insulating film;
forming, on the ion conductor, a second electrode layer that contains at least Ru, nitrogen and a first metal; and
forming a variable resistance element that includes the first electrode formed from the first electrode layer, the ion conducing layer, and the second electrode by pattering the second electrode layer and the ion conductor.

(Supplementary Note 14)
The method for producing a variable resistance element according to Supplementary note 12 or 13, the method including:
after forming the second electrode layer, forming, on the second electrode layer, a third electrode layer that contains at least the first metal and nitrogen, forming a variable resistance element that includes a first electrode formed from the first electrode layer, the ion conducting layer, the second electrode and a third electrode by patterning the third electrode layer, the second electrode layer and the ion conductor.

The present invention has been described by using the example embodiments described above as model examples. However, the present invention is not limited to the example embodiments described above. The present invention can employ various modes that can be understood by those skilled in the art within the scope of the present invention.

This application is based upon and claims the benefit of priority from Japanese Patent Application No. 2015-118014, filed on Jun. 11, 2015, the disclosure of which is incorporated herein in its entirety by reference.

REFERENCE SIGNS LIST

1 First electrode
2, 106, 804a, 904a Second electrode
3, 105, 803, 903 Ion conducting layer
4, 107, 804b, 904b Third electrode

103, 405, 808, 908a, 908b First copper wiring serving as a first electrode
113, 201, 501 Variable resistance element
899 Two-terminal switch
999 Three terminal switch

What is claimed is:

1. A variable resistance element comprising a first electrode that contains at least copper, a second electrode that contains at least Ru, nitrogen and a first metal, and an ion conducting layer positioned between the first electrode and the second electrode,
wherein a content of nitrogen in the second electrode is less than 20 atm %.

2. The variable resistance element according to claim 1, wherein the first metal has negatively greater standard formation free energy of oxidation than that of Ru.

3. The variable resistance element according to claim 1, wherein the first metal is at least one of Ti, Ta, Al, Mn, Zr, Hf, Mg, Co and Zn.

4. The variable resistance element according to claim 1, wherein the second electrode has a hexagonal close-packed structure.

5. The variable resistance element according to claim 1, wherein a content of the first metal in the second electrode is greater than or equal to 10 atm % and less than 20 atm %.

6. The variable resistance element according to claim 1, wherein a content of the nitrogen and a content of the first metal in the second electrode are equal.

7. The variable resistance element according to claim 1, wherein a ratio between the nitrogen and the first metal in the second electrode is a stoichiometric composition.

8. The variable resistance element according to claim 1, wherein the sum of a content of the nitrogen and a content of the first metal in the second electrode is less than or equal to 40 atm %.

9. The variable resistance element according to claim 1, further comprising a third electrode that is in contact with the second electrode and is not in contact with the ion conducting layer, wherein the third electrode contains at least the first metal and nitrogen.

10. The variable resistance element according to claim 1, wherein the first electrode contains the first metal in addition to copper.

* * * * *